(12) United States Patent
Lin et al.

(10) Patent No.: US 12,538,630 B2
(45) Date of Patent: Jan. 27, 2026

(54) DISPLAY PANEL AND MANUFACTURING METHOD THEREOF

(71) Applicant: AUO Corporation, Hsin-Chu (TW)

(72) Inventors: Bin-Cheng Lin, Hsin-Chu (TW);
Bo-Ru Jian, Hsin-Chu (TW);
Chi-Sheng Liao, Hsin-Chu (TW);
Ta-Wen Liao, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 486 days.

(21) Appl. No.: 18/161,383

(22) Filed: Jan. 30, 2023

(65) Prior Publication Data

US 2023/0275117 A1 Aug. 31, 2023

Related U.S. Application Data

(60) Provisional application No. 63/313,744, filed on Feb. 25, 2022.

(30) Foreign Application Priority Data

Jun. 30, 2022 (TW) .................................. 111124607

(51) Int. Cl.
*H10H 29/14* (2025.01)
*H10H 20/01* (2025.01)

(52) U.S. Cl.
CPC .......... *H10H 29/142* (2025.01); *H10H 20/01* (2025.01)

(58) Field of Classification Search
CPC ... H10H 29/142; H10H 20/857; H01L 25/167
See application file for complete search history.

(56) References Cited

U.S. PATENT DOCUMENTS

2023/0095458 A1* 3/2023 Zheng .................... H10K 77/10
257/91

FOREIGN PATENT DOCUMENTS

| CN | 106405962 A | 2/2017 |
|---|---|---|
| CN | 107346803 A | 11/2017 |
| CN | 111781770 A | 10/2020 |
| CN | 111952348 A | 11/2020 |
| CN | 113380779 A | 9/2021 |

* cited by examiner

*Primary Examiner* — Ratisha Mehta
(74) *Attorney, Agent, or Firm* — WPAT, PC

(57) ABSTRACT

A display panel includes a substrate, an LED array disposed on the front side of the substrate, a driving circuit disposed on the front side of the substrate and connected to the LED array, a connecting line and a transparent conductive layer disposed on the back side of the substrate. The connecting line is spaced apart with a side surface of the substrate thereby defining a cutting area. The transparent conductive layer extends from the cutting area and at least partially covering the connecting line. The display panel further includes a first passivation layer and a conductive layer. The first passivation layer is disposed on the transparent conductive layer and the connecting line. The side surfaces of the first passivation layer, the transparent conductive layer, and the substrate are aligned. The conductive layer penetrates the first passivation layer to connect the transparent conductive layer to the driving circuit.

11 Claims, 16 Drawing Sheets

DISPLAY PANEL AND MANUFACTURING METHOD THEREOF

RELATED APPLICATIONS

This application claims priority to Taiwanese Application Serial Number 111124607, filed Jun. 30, 2022, and U.S. Provisional Application Ser. No. 63/313,744, filed Feb. 25, 2022, the entirety of which is incorporated by reference herein in their entireties.

BACKGROUND

Field of Invention

The present invention relates to a display panel and method of manufacturing the same.

Description of Related Art

With the development of the display technique, the desire to the narrow frame displays or frameless displays is increased. The decreasing area of the frame can satisfy the requirement of greater display area. However, the narrow frame displays or frameless displays face a challenge of narrow line width and high wiring density. For the forgoing reasons, there is a need for maintaining the yield of the display and satisfying narrow frame or frameless requirement of the display.

SUMMARY

An aspect of the disclosure provides a display panel. The display panel includes a substrate having a front surface and a back surface opposite to each other, a light-emitting diode (LED) array disposed on the front surface of the substrate, a driving circuit disposed on the front surface of the substrate and being coupled to the LED array, a connecting line disposed on the back surface of the substrate, a transparent conductive layer disposed on the back surface of the substrate, a first passivation layer disposed on the transparent conductive layer and the connecting line, and a conductive layer. The connecting line is spaced from a side surface of the substrate by a distance such that a cutting area is defined. The transparent conductive layer is extended from the cutting area and at least partially covers the connecting line. A side surface of the first passivation layer, a side surface of the transparent conductive layer, and the side surface of the substrate are aligned. An end of the conductive layer penetrates the first passivation layer to couple to the transparent conductive layer, and another end of the conductive layer couples to the driving circuit.

According to some embodiments of the disclosure, the connecting line includes a first region adjacent the cutting area, a third region, and a second region between the first region and the third region, the transparent conductive layer covers the first region and the second region, and the first passivation layer is disposed on the first region and the third region.

According to some embodiments of the disclosure, the display panel further includes a driving circuit board and a conductor material connecting the transparent conductive layer on the second region to the driving circuit board.

According to some embodiments of the disclosure, the display panel further includes a second passivation layer disposed on a first portion of the first passivation layer on the first region and the third region, and a protection layer disposed on the second passivation layer and disposed on a second portion of the first passivation layer on cutting area.

According to some embodiments of the disclosure, the first passivation layer directly contacts the third region of the connecting line.

According to some embodiments of the disclosure, the transparent conductive layer is disposed between the first passivation layer and the third region of the connecting line.

According to some embodiments of the disclosure, the display panel further includes a repairing metal embedded in the connecting line and covered by the first passivation layer.

According to some embodiments of the disclosure, the display panel further includes a repairing metal embedded in the connecting line and the transparent conductive layer and covered by the first passivation layer.

According to some embodiments of the disclosure, the display panel further includes a transparent insulating layer disposed between the connecting line and the substrate.

According to some embodiments of the disclosure, the transparent conductive layer directly contacts the transparent insulating layer, at the cutting area.

According to some embodiments of the disclosure, the transparent conductive layer directly contacts the substrate, at the cutting area.

An aspect of the disclosure provides a display panel. The display panel includes a substrate having a front surface and a back surface opposite to each other, a light-emitting diode (LED) array disposed on the front surface of the substrate, a driving circuit disposed on the front surface of the substrate and being coupled to the LED array, a connecting line disposed on the back surface of the substrate, a transparent conductive layer disposed on the back surface of the substrate, a first passivation layer covering a portion of the transparent conductive layer on the connecting line, and a conductive layer. The connecting line is spaced from a side surface of the substrate by a distance such that a cutting area is defined. The transparent conductive layer is extended from the cutting area and at least partially covers the connecting line, and a side surface of the transparent conductive layer aligns the side surface of the substrate. The first passivation layer does not extend into the cutting area. An end of the conductive layer is coupled to the transparent conductive layer, and another end of the conductive layer is coupled to the driving circuit.

According to some embodiments of the disclosure, the connecting line comprises a first region adjacent the cutting area, a third region, and a second region between the first region and the third region, the transparent conductive layer covers the first region and the second region, and the first passivation layer is disposed on the first region and the third region.

According to some embodiments of the disclosure, the display panel further includes a driving circuit board, and a conductor material connecting the transparent conductive layer on the second region to the driving circuit board.

According to some embodiments of the disclosure, the display panel further includes a repairing metal embedded in the connecting line and covered by the first passivation layer.

According to some embodiments of the disclosure, the display panel further includes a repairing metal embedded in the connecting line and the transparent conductive layer and covered by the first passivation layer.

According to some embodiments of the disclosure, the display panel further includes a transparent insulating layer disposed between the connecting line and the substrate.

According to some embodiments of the disclosure, the transparent conductive layer directly contacts the transparent insulating layer, at the cutting area.

According to some embodiments of the disclosure, the transparent conductive layer directly contacts the substrate, at the cutting area.

Another aspect of the disclosure provides a method of manufacturing a display panel. The method includes forming a light-emitting diode (LED) array and a driving circuit coupled to the LED array on a front surface of a substrate; flipping the substrate and forming a patterned metal layer on a back surface of the substrate, the patterned metal layer comprising a connection line and a test pad spaced apart from each other thereby defining a cutting area between the connection line and the test pad; forming a transparent conductive layer on the back surface of the substrate, wherein the transparent conductive layer interconnects the connection line and the test pad; performing an electrical testing comprising using a probe contacting the transparent conductive layer on the test pad; and after the performing the electrical testing, cutting the substrate along the cutting area, to obtain the display panel.

According to some embodiments of the disclosure, a side surface of the substrate and a side surface of the transparent conductive layer are aligned, after the cutting the substrate along the cutting area.

According to some embodiments of the disclosure, the method further includes after performing an electrical testing and prior to the cutting the substrate along the cutting area, forming a first passivation layer on the transparent conductive layer, wherein a side surface of the substrate and a side surface of the transparent conductive layer, and a side surface of the first passivation layer are aligned, after the cutting the substrate along the cutting area.

According to some embodiments of the disclosure, when a defect is found after performing the electrical testing, the method further comprises repairing the defect before the first passivation layer is formed.

According to some embodiments of the disclosure, the method further includes forming a second passivation layer on the first passivation layer; forming a protection layer on the second passivation layer; forming an opening penetrating the first passivation layer, the second passivation layer, and the protection layer to expose the transparent conductive layer; filling a conductor material in the opening; and connecting a driving circuit board to the conductor material.

According to some embodiments of the disclosure, the method further includes after cutting the substrate along the cutting area, forming a conductive layer connecting the transparent conductive layer at the back surface of the substrate to the driving circuit at the front surface of the substrate.

The method of manufacturing the display panel and the display panel thereof include performing the electrical test to the metal layer and the transparent conductive layer right after the metal layer and the transparent conductive layer are patterned. The defect can be found and repaired after the electrical test is performed. Because there is no other layer covering the connecting line and the transparent conductive layer when the defect is detected and repaired, the position of the defect can be observed easily, and the repairing metal can be filled in the defect easily. The cutting area does not include the metal layer such that the thickness of the cutting area is reduced.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
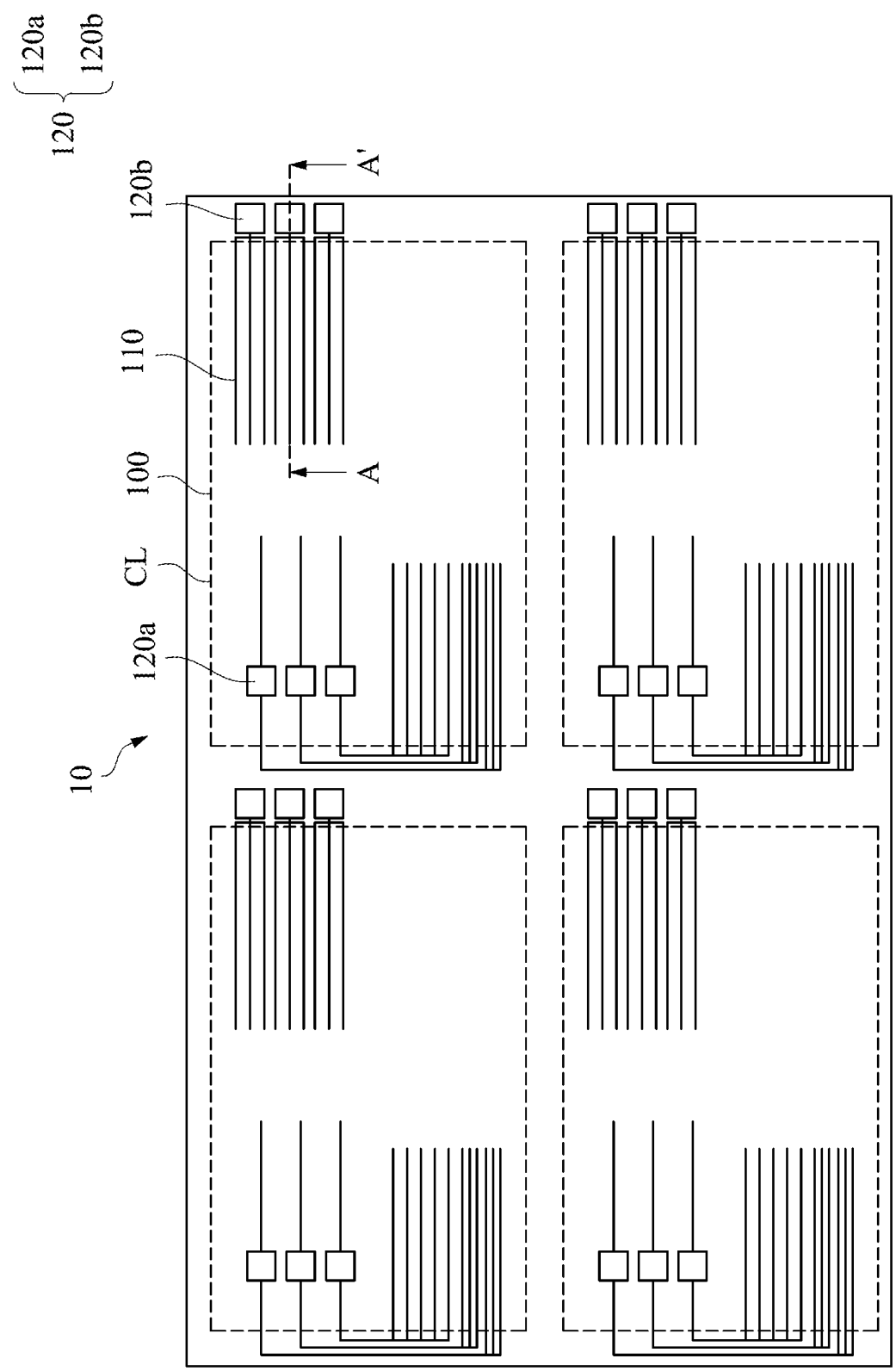
FIG. 1 and FIG. 2 are backside views of a display panel of different manufacturing stages according to some embodiments of the disclosure, respectively.

Reference will now be made in detail to the present embodiments of the invention, examples of which are illustrated in the accompanying drawings. Wherever possible, the same reference numbers are used in the drawings and the description to refer to the same or like parts.

Figure 2:
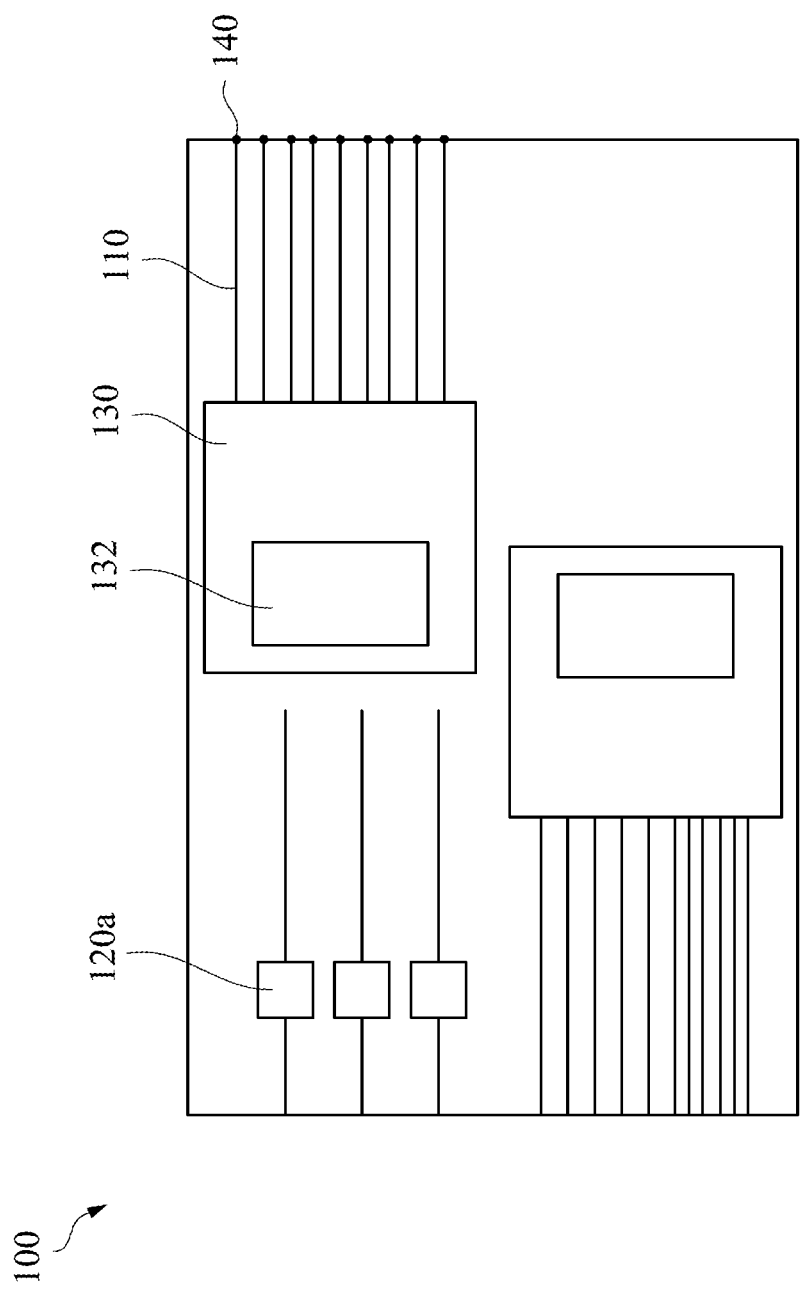

Reference is made to FIG. 1 and FIG. 2, which are backside views of a display panel of different manufacturing stages according to some embodiments of the disclosure, respectively, in which the backside is opposite to the display side (e.g. the front side). In FIG. 1, the mother board 10 includes a plurality of display panels 100, in which each of the display panels 100 is defined by the cutting lines CL on the mother board 10. Each display panel 100 includes a plurality of connecting lines 110 and a plurality of test pads 120 connected to the connecting lines 110. The test pads 120 such as the test pads 120a can be disposed within the display panel 100. Alternatively, the test pads 120 such as the test pads 120b can be disposed outside of the display panel 100 and between the cutting lines CL.

In some embodiments, the electrical testing using the test pads 120 is performed prior to the step of cutting the mother board 10 along the cutting lines CL to get the display panels 100. After the cutting process, as shown in FIG. 2, the test pads 120a disposed within the display panel 100 are remained, and the test pads 120b disposed outside of the display panel 100 are removed. Then the driving circuit board 130 having a driving chip 132 thereon is coupled to the connecting lines 110. The connecting lines 110 at the back surface of the display panel 100 are connected to the front side circuit through the conductive layer 140 such that the fabrication of the display panel 100 is completed.

With the thin and narrow frame trend of developing the display, a challenge of narrow line width and high wiring density need to be solved. By performing electrical testing to the display panels 100 prior to cutting the mother board 10, the defects of the connecting lines 110 can be found in advance. The defects of the connecting lines 110 can be repaired, and an additional electrical testing is performed to the repaired connecting lines 110. After the repaired connecting lines 110 pass the electrical testing, the following assembly processes can be proceeded. Because the display panel 100 includes stacks of many conductive layers and dielectric layers, it is benefit to find and is easy to repair the defects of the connecting lines 110 at the early manufacturing stages.

Figure 3:
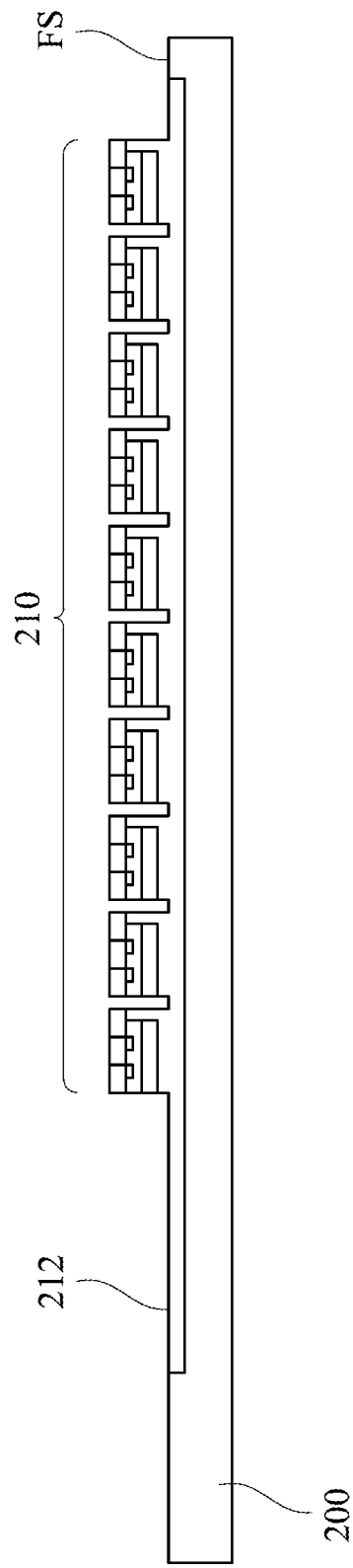
FIGS. 3, 4, 6, 7, 8, 9, 11, and 12 are cross-sectional views, taken along line A-A of FIG. 1, of the different stages of manufacturing the display panel, according to some embodiments of the disclosure, respectively.
Figure 4:
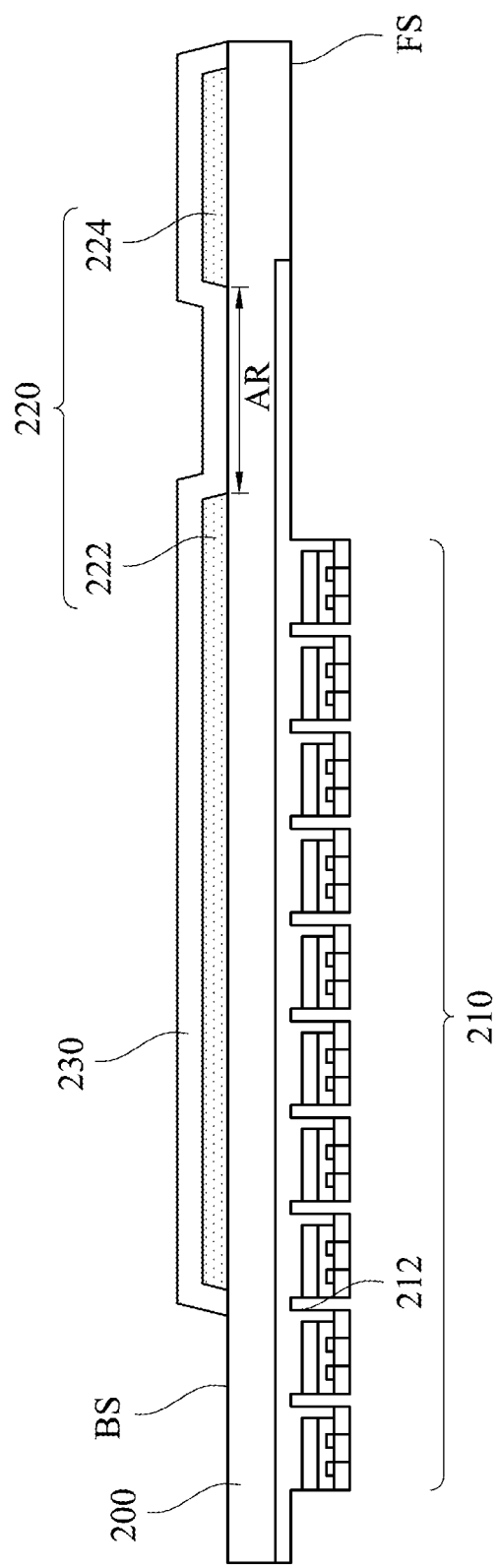
Figure 5:
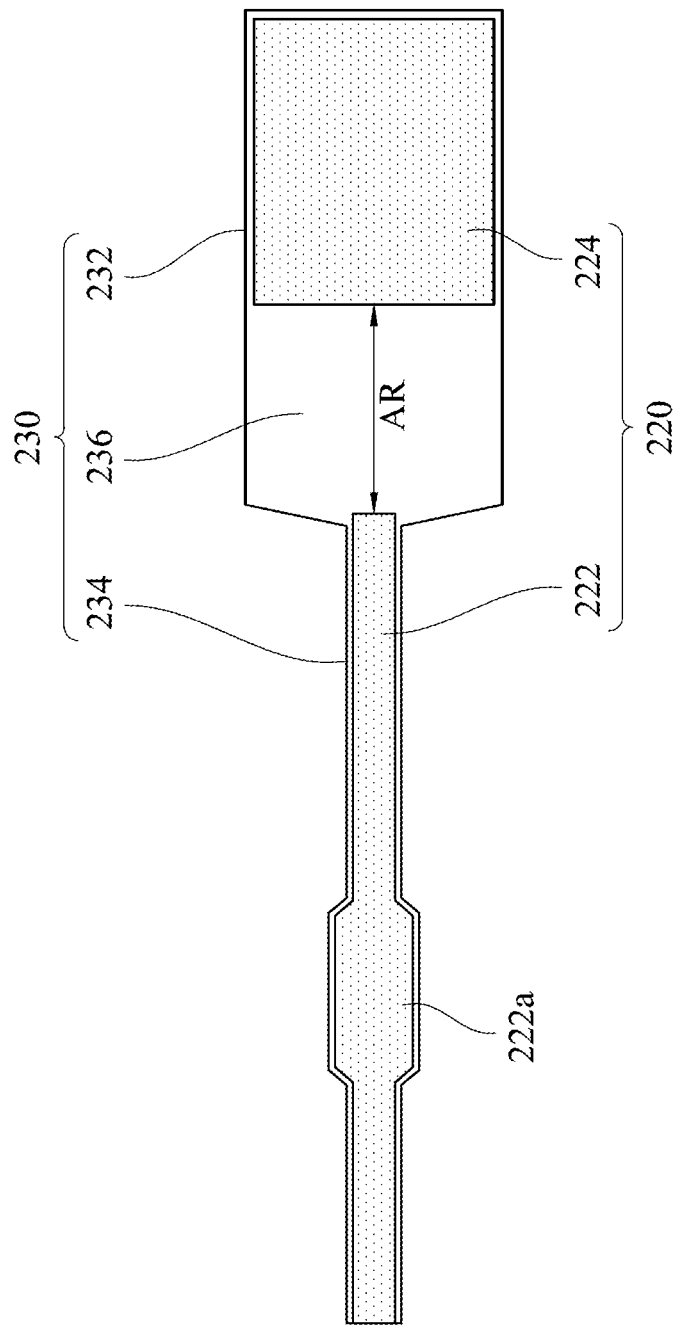
FIG. 5 is a top view of FIG. 4.
Figure 7:
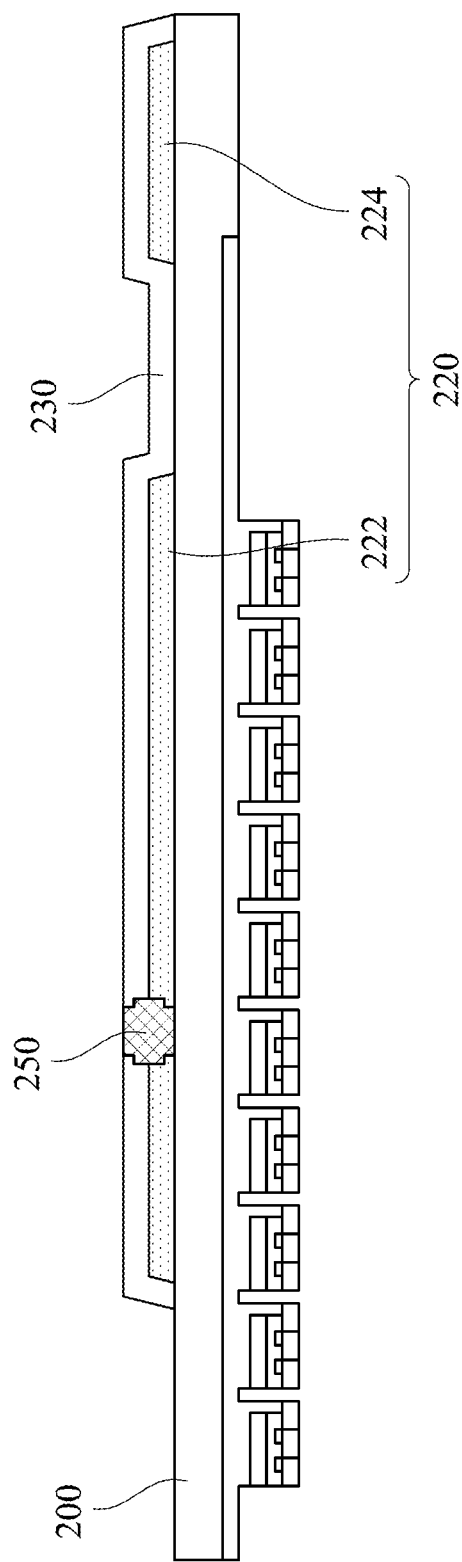
Figure 8:
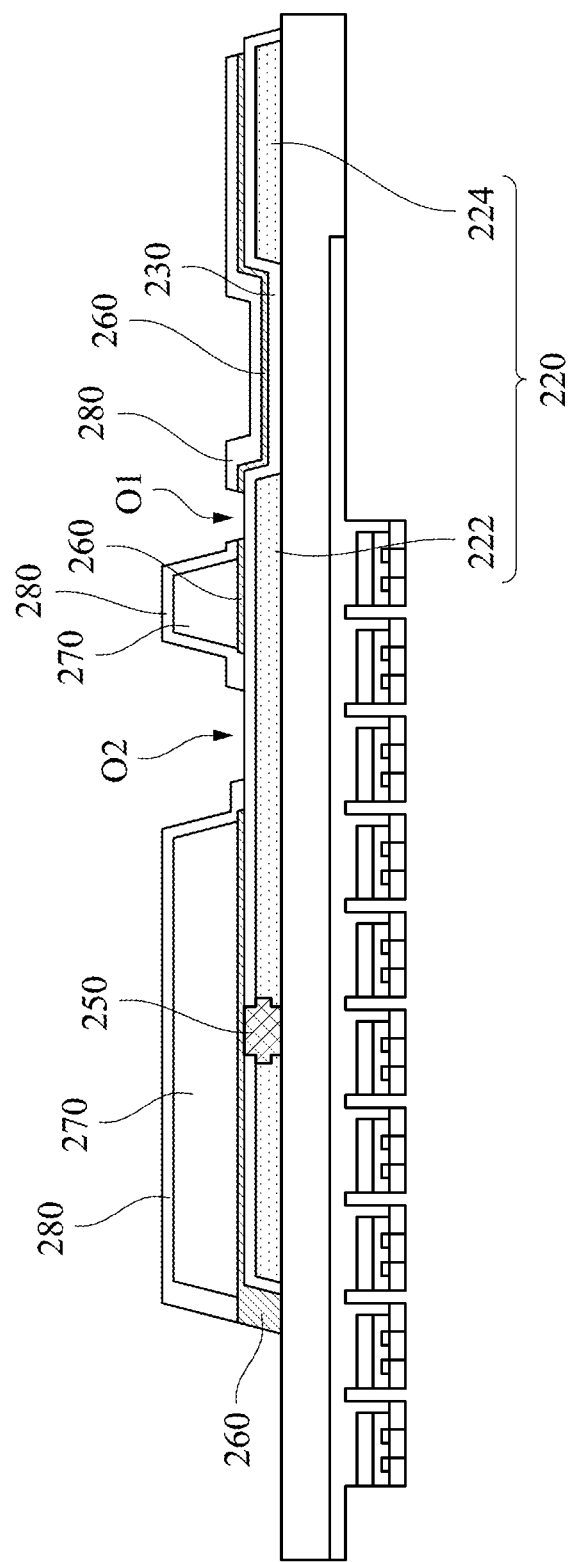
Figure 9:
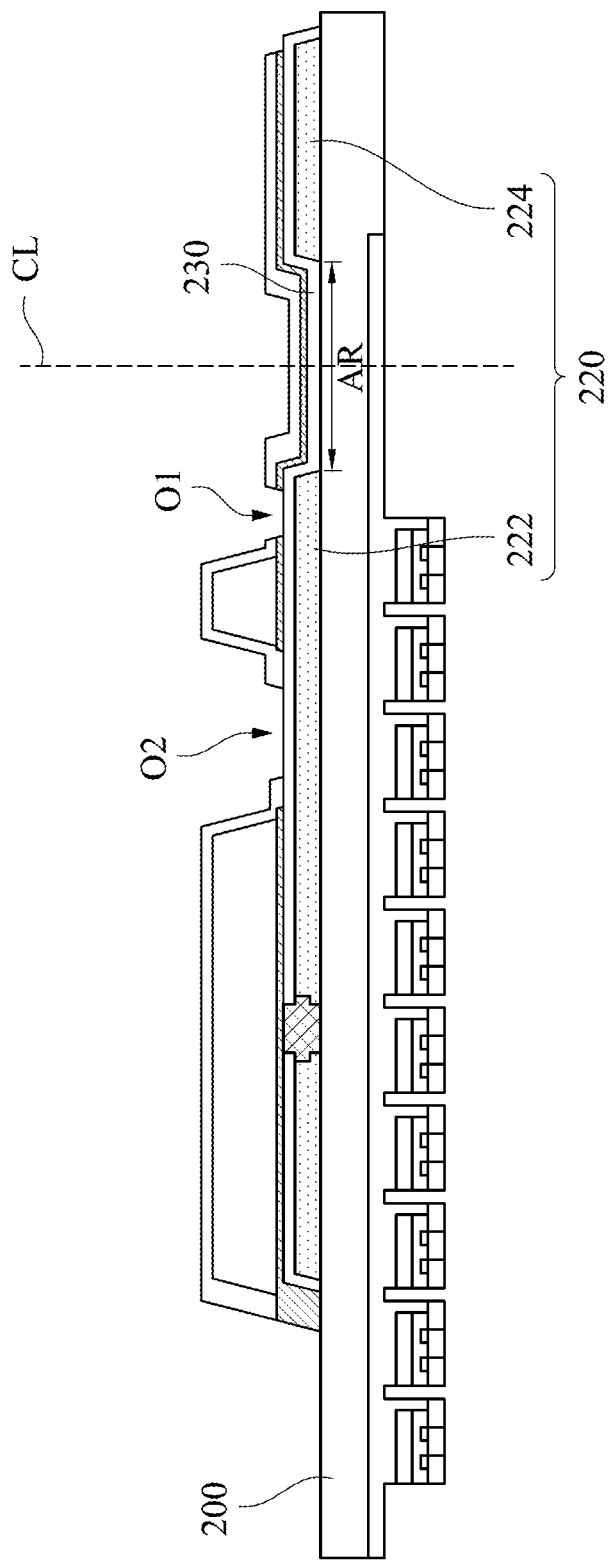
Figure 10:
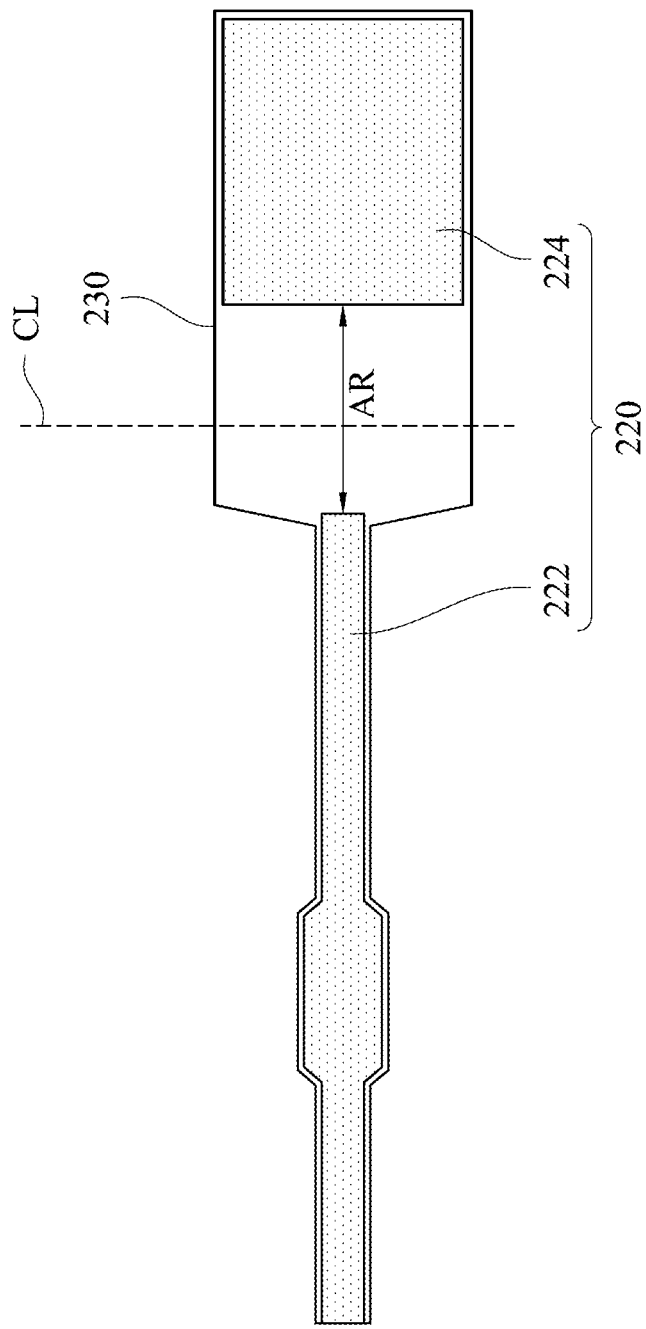
FIG. 10 is a top view illustrating the connecting line of FIG. 9.

Reference is made to FIG. 3 to FIG. 12, in which FIGS. 3, 4, 6, 7, 8, 9, 11, and 12 are cross-sectional views, taken along line A-A of FIG. 1, of the different stages of manufacturing the display panel, according to some embodiments of the disclosure, respectively, FIG. 5 is a top view of FIG. 4, and FIG. 10 is a top view illustrating the connecting line of FIG. 9.

First, as shown in FIG. 3, the front side processes are made on the front surface FS of the substrate 200. For example, the front side processes include forming a micro light-emitting diode (μLED) array 210 on the front surface FS of the substrate 200 and forming a driving circuit 212 electrically connected to the μLED array 210 on the front surface FS of the substrate 200. The formation of the μLED array 210 includes forming a stack of a plurality of metal layers, semiconductor layers, passivation layers, dielectric layers, and vias.

Then, as shown in FIG. 4, the substrate 200 is flipped. The driving circuit and the related testing circuit are formed on the back surface BS of the substrate 200. A patterned metal layer 220 is formed on the back surface BS of the substrate 200. The steps of forming the patterned metal layer 220 includes depositing a metal material on the back surface BS of the substrate 200 and etching the metal material to remove the unnecessary portions of the metal material thereby defining the desired patterned metal layer 220. In some embodiments, the material of the patterned metal layer 220 includes Cu, Al, Ag, and alloys thereof. In order to prevent the patterned metal layer 220 from being oxidized due to being exposed in the environment for a long time in the following processes, a patterned transparent conductive layer 230 is formed on the patterned metal layer 220 to protect the underlying patterned metal layer 220 from being damaged by the oxygen and moisture in the environment. The material of the transparent conductive layer 230 can be conductive material having high transparency, such as $In_2O_3$, $SnO_2$, ITO, ZnO, or other similar materials.

Reference is made to both FIG. 4 and FIG. 5. The patterned metal layer 220 includes a connecting line 222 and a test pad 224. The test pad 224 is a block structure, and the connecting line 222 is a linear structure. The connecting line 222 is not directly connected to the test pad 224. There is a space between the connecting line 222 and test pad 224, and the space is defined as a cutting area AR.

In some embodiments, the test pad 224 is disposed on the front surface FS of the substrate 200 and is laterally extended from the μLED array 210. The test pad 224 does not overlap the μLED array 210. The connecting line 222 and the test pad 224 are electrically connected by the transparent conductive layer 230. More particularly, the transparent conductive layer 230 has a first portion 232 on the test pad 224, a second portion 234 on the connecting line 222, and a third portion 236 on the cutting area AR at the back surface BS of the substrate 200. The third portion 236 connects the first portion 232 to the second portion 234.

In some embodiments, the connecting line 222 is completely covered by the transparent conductive layer 230. In some embodiments, the transparent conductive layer 230 has a partially enlarged segment such as the segment 222a. The partially enlarged segment 222a is benefit to couple to other components in the following processes.

Figure 6:
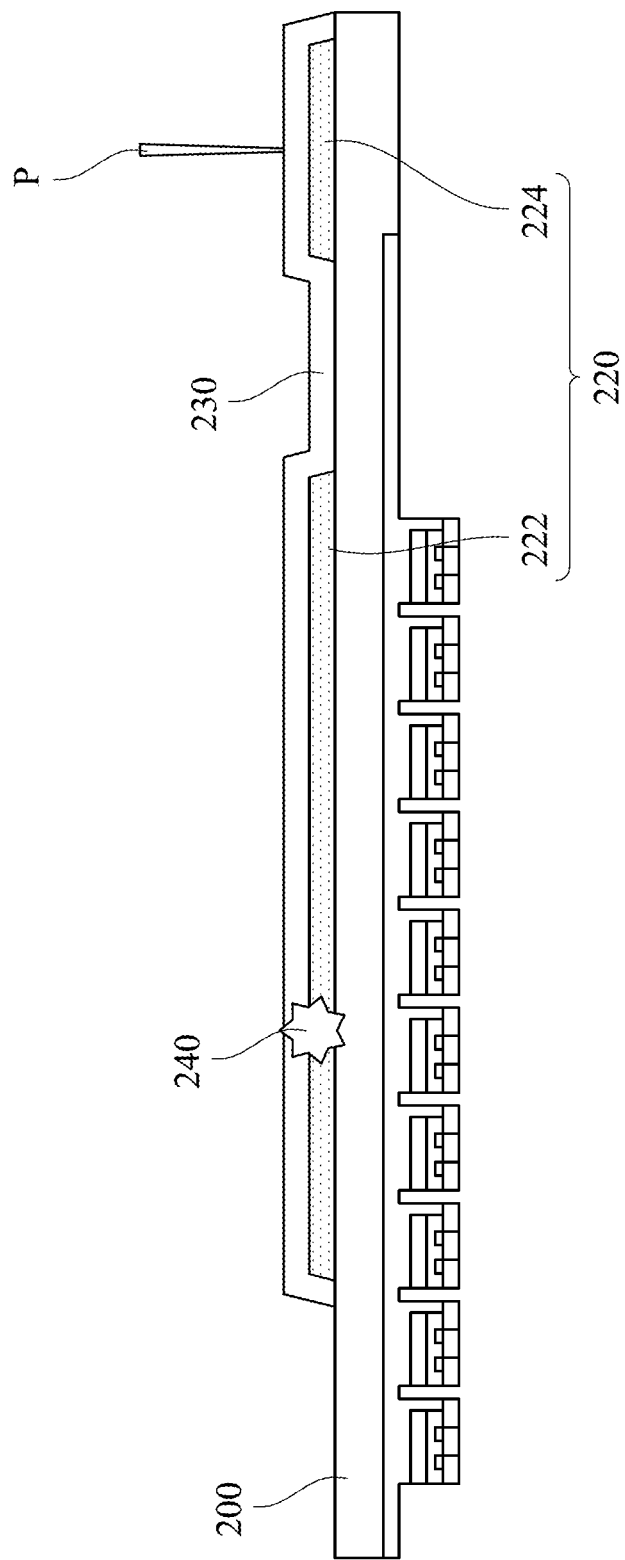

Reference is made to FIG. 6. After the patterned metal layer 220 and the transparent conductive layer 230 are formed, an electrical testing is performed. The electrical testing includes using a probe P contacting the portion of the transparent conductive layer 230 on the test pad 224, to measure the resistance of the connecting line 222 which is electrically connected to the test pad 224 through the transparent conductive layer 230. If the measured resistance is abnormal, that means the connecting line 222 electrically connected to the test pad may be damaged during the aforementioned patterning process.

For example, in this embodiment, the defect 240 such as a line broken defect is found at the electrical testing of the connecting line 222, and the defect 240 exists also in the transparent conductive layer 230 on the connecting line 222.

Reference is made to FIG. 7. The defect 240 (shown in FIG. 6) is repaired. For example, a repairing metal 250 is filled in the position of the defect 240, and the broken connecting line 222 and/or the transparent conductive layer 230 is connected by the repairing metal 250. In some embodiments, the repairing metal 250 includes tungsten, and the tungsten is filled in the position of the defect 240 by a laser repairing technique. The repairing metal 250 is embedded and contacts the connecting line 222 and/or the transparent conductive layer 230.

Because there is no other layer covering the connecting line 222 and the transparent conductive layer 230 when the defect 240 is detected and repaired, the position of the defect 240 can be observed easily, and an additional process of removing upper material layer to reveal the defect 240 is not required. Therefore, the efficiency and quality of the repairing process can be improved.

After the repairing metal 250 is embedded in the connecting line 222 and the transparent conductive layer 230, as illustrated in FIG. 8, a first passivation layer 260, a second passivation layer 270, and a protection layer 280 are sequentially formed on the connecting line 222 and the transparent conductive layer 230. The material of the first passivation layer 260, the second passivation layer 270, and the protection layer 280 can be dielectric material such as $SiO_2$, SiN, SiC, SION, or the like. The first passivation layer 260, the second passivation layer 270, and the protection layer 280 can be deposited by a CVD, PVD, ALD or other suitable process. The thickness of the second passivation layer 270 can be greater than the thickness of first passivation layer 260.

In some embodiments, the first passivation layer 260, the second passivation layer 270, and the protection layer 280 are patterned to form a first opening O1 and a second opening O2 therein. The first opening O1 and the second opening O2 penetrate the first passivation layer 260, the second passivation layer 270, and the protection layer 280, respectively, such that portions of the transparent conductive layer 230 are exposed from the first opening O1 and the second opening O2, respectively.

In some embodiments, only the first passivation layer 260 and the protection layer 280 are disposed on the testing pad 224, the cutting area AR, and a portion of the connecting line 222 between the first opening O1 and the cutting area AR, without the second passivation layer 270 therebetween, thereby reducing the thickness at this region.

Reference is made to FIG. 9 and FIG. 10. The substrate 200 is cut along the cutting line CL, and the portion of the substrate 200 outside of the cutting line CL is removed. In some embodiments, the cutting line CL cuts through the region between the testing pad 224 and the connecting line 222, and the cutting line CL does not cut through the metal layer 220. Namely, the area between the testing pad 224 and the connecting line 222 and covered by the transparent conductive layer 230 serves as the predetermined cutting area AR, and the cutting line CL cuts through the predetermined cutting area AR.

Because the cutting line CL does not cut through the metal layer 220, therefore, the metal layer 220 close to the edge of the substrate 200 is still protected by the transparent conductive layer 230 and is free from being directly exposed in the environment. Additionally, the cutting line CL cuts through the cutting area AR, and the thickness of the cutting area AR is thinner than other region. Therefore, the difficulty of the cutting process is reduced.

Figure 11:
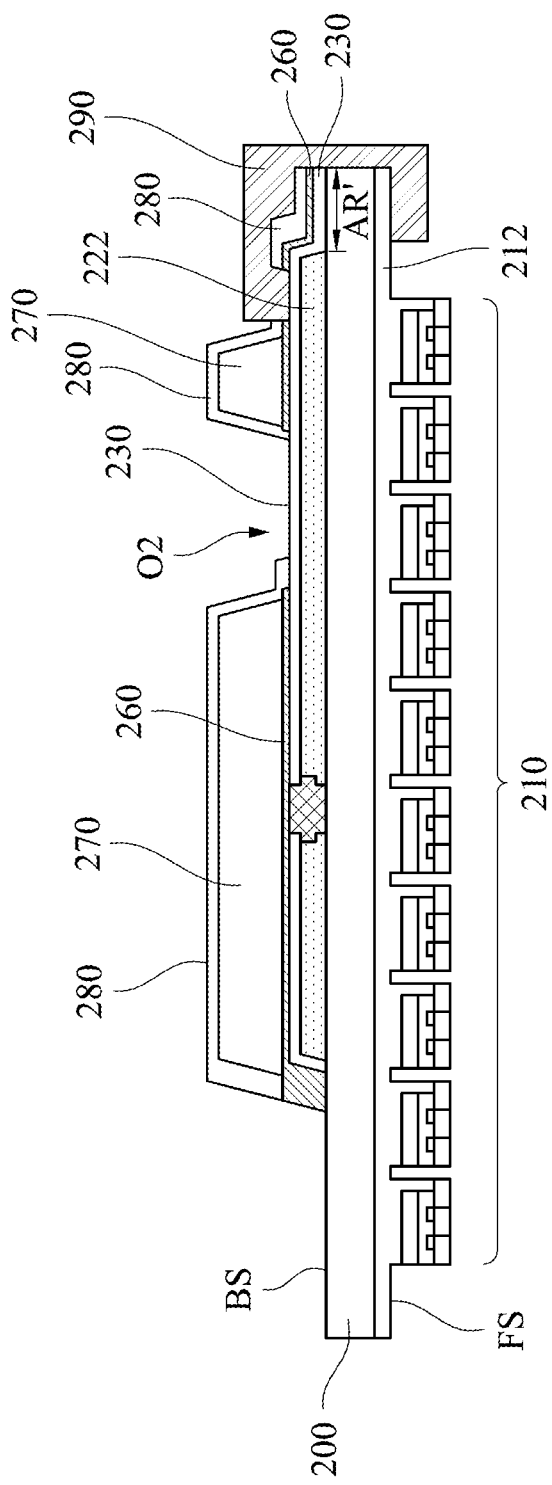

Reference is made to FIG. 11. After the cutting process is performed, a conductive layer 290 is utilized to connect the driving circuit 212 at the front surface FS of the substrate 200 to the corresponding connecting line 222 at the back surface BS of the substrate 200, such that the signal is communicated between the front surface FS of the substrate 200 and the back surface BS of the substrate 200. In some embodiments, the conductive layer 290 can be formed on the substrate 200 by a welding process, a printing process, or an electrical plating process. In some embodiments, the corresponding conductive layer 290 can be a solder, a silver paste, or a metal.

More particularly, the conductive layer 290 continuously extends on the front surface FS, the side surface SS, and the back surface BS of the substrate 200. At the front surface FS of the substrate 200, an end of the conductive layer 290 is directly coupled to the driving circuit 212. At the back surface BS of the substrate 200, the conductive layer 290 covers the transparent conductive layer 230, the first passivation layer 260, and the protection layer 280 on the remaining cutting area AR', and another end of the conductive layer 290 penetrates the first passivation layer 260 and the protection layer 280 to fill in the first opening O1 (shown in FIG. 9) to directly couple to the transparent conductive layer 230 exposed by the first opening O1. Additionally, the transparent conductive layer 230 further covers and directly contacts the connecting line 222. As a result, the driving circuit 212 at the front surface FS of the substrate 200 is electrically connected to the connecting line 222 at the back surface BS of the substrate 200 by the conductive layer 290.

Figure 12:
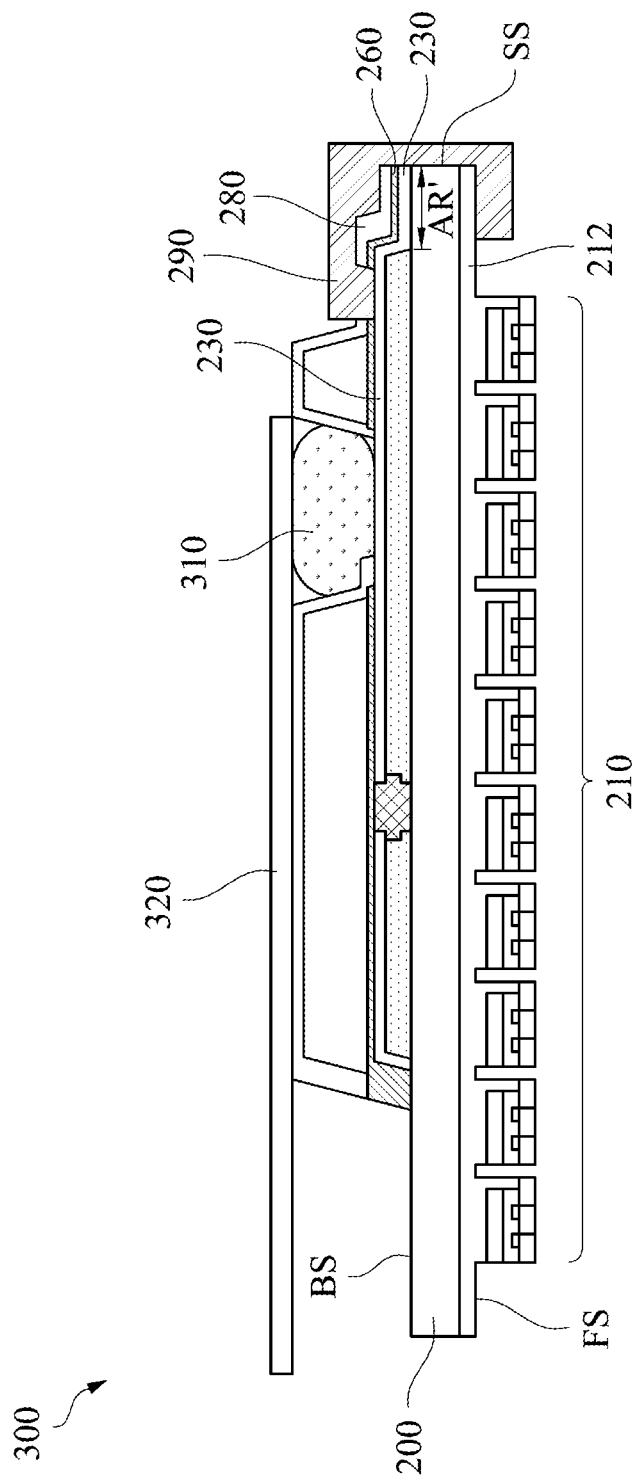

Reference is made to FIG. 12. A conductor material 310 such as anisotropic conductive film (ACF) is filled in the second opening O2 (shown in FIG. 11). The driving circuit board 320 is coupled to the conductor material 310 to form the display panel 300. The signal generated from the driving circuit board 320 is sent to the connecting line 222 and the transparent conductive layer 230 through the conductor material 310, then the signal is further sent to the driving circuit 212 to control the μLED array 210.

The method of manufacturing the display panel as disclosed above includes performing the electrical test to the metal layer 220 and the transparent conductive layer 230 right after the metal layer 220 and the transparent conductive layer 230 are patterned. The defect can be found and repaired after the electrical test is performed. Because there is no other layer covering the connecting line 222 and the transparent conductive layer 230 when the defect 240 is detected and repaired, the position of the defect 240 can be observed easily. The cutting area AR' does not include the metal layer 220 such that the thickness of the cutting area AR' is thinner than other region. The transparent conductive layer 230 is directly disposed on the cutting area AR' of the back surface BS of the substrate 200 and extends above the connecting line 222. The transparent conductive layer 230 disposed between the metal layer 220 and the first passivation layer 260. In some embodiments, the side surface of the transparent conductive layer 230, the side surface of the first passivation layer 260, the side surface of protection layer 280, and the side surface SS of the substrate 200 are aligned and coplanar.

Figure 13:
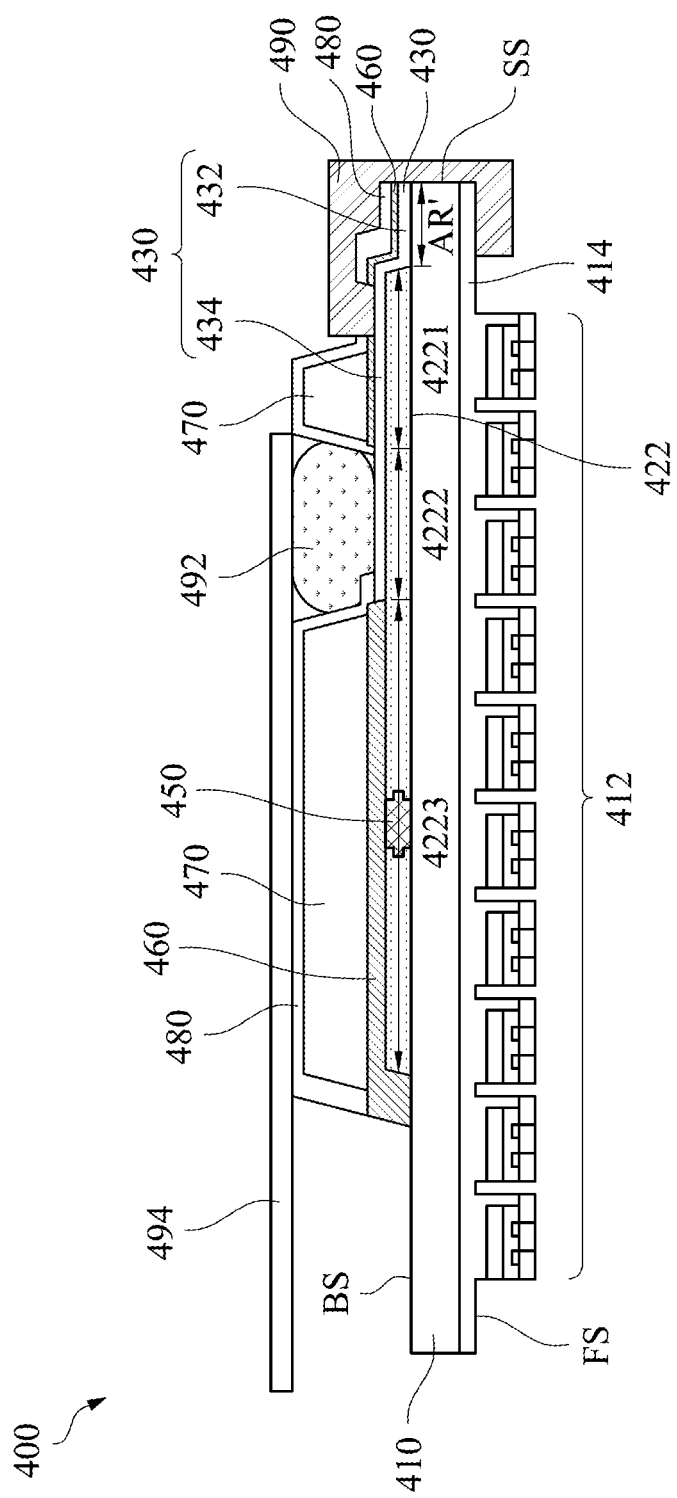
FIG. 13 is a cross-sectional view of some other embodiments of the display panel of the disclosure.

Reference is made to FIG. 13, which is a cross-sectional view of some other embodiments of the display panel of the disclosure. In some embodiments, the display panel 400 includes a substrate 410, a μLED array 412 and a driving circuit 414 at the front surface FS of the substrate 410, a connecting line 422 and a transparent conductive layer 430 at the back surface BS of the substrate 410. There is a distance between the connecting line 422 and an edge of the substrate 410, and the region between the connecting line 422 and the edge of the substrate 410 is the remaining cutting area AR'.

A first portion 432 of the transparent conductive layer 430 is disposed on the cutting area AR' at the back surface BS of the substrate 410. A second portion 434 of the transparent conductive layer 430 is extended from the first portion 432 to the connecting line 422, and the second portion 434 of the transparent conductive layer 430 partially covers the connecting line 422. The display panel 400 further includes a first passivation layer 460, a second passivation layer 470 on the first passivation layer 460, and a protection layer 480 on the second passivation layer 470. The first passivation layer 460, the second passivation layer 470, and the protection layer 480 partially cover the connecting line 422 to expose a portion of the transparent conductive layer 430.

For example, the connecting line 422 has a first region 4221, a second region 4222, and a third region 4223. The first region 4221 is disposed adjacent to the cutting area AR', and the second region 4222 is between the first region 4221 and the third region 4223. The first portion 432 of the transparent conductive layer 430 is disposed on the cutting area AR'. The second portion 434 of the transparent conductive layer 430 is disposed on the first region 4221 and the second region 4222 and is not disposed on the third region 4223. The first passivation layer 460 is disposed on the cutting area AR', the first region 4221, and the third region 4223 and is not disposed on the second region 4222. The second passivation layer 470 is disposed on the first region 4221 and the third region 4223 and is not disposed on the cutting area AR' and the second region 4222. The protection layer 480 is disposed on the cutting area AR', the first region 4221, and the third region 4223 and is not disposed on the second region 4222.

In some embodiments, as shown in FIG. 13, the first passivation layer 460 is directly on contact with the third region 4223 of the connecting line 422. In some other embodiments, as shown in FIG. 12, the transparent conductive layer 230 is between the first passivation layer 260 and the third region of the connecting line 222.

In some embodiments, the side surface of the transparent conductive layer 430, the side surface of the first passivation layer 460, the side surface of protection layer 480, and the side surface SS of the substrate 410 are aligned and coplanar. In some embodiments, the display panel 400 may be repaired. For example, a broken line issue is found at the third region 4223 of the connecting line 422, and the repairing metal 450 is embedded in the connecting line 422 and is covered by the first passivation layer 460.

The display panel 400 further includes a conductive layer 490. The conductive layer 490 connects the transparent conductive layer 430 at the back surface BS of the substrate 410 to the driving circuit 414 at the front surface FS of the substrate 410. More particularly, the conductive layer 490 covers the cutting area AR', the first passivation layer 460 and the protection layer 480 has an opening at the first region 4221 to expose the transparent conductive layer 430. The conductive layer 490 passes through the opening of the first passivation layer 460 and the protection layer 480 to couple to the transparent conductive layer 430.

The second region 4222 of the connecting line 422 is free of disposed with the first passivation layer 460, the second passivation layer 470, and the protection layer 480. Therefore, the conductive material 492 such as ACF of the display panel 400 is coupled to the transparent conductive layer 430 on the second region 4222 of the connecting line 422, and the conductive material 492 is further coupled to the driving circuit board 494.

Figure 14:
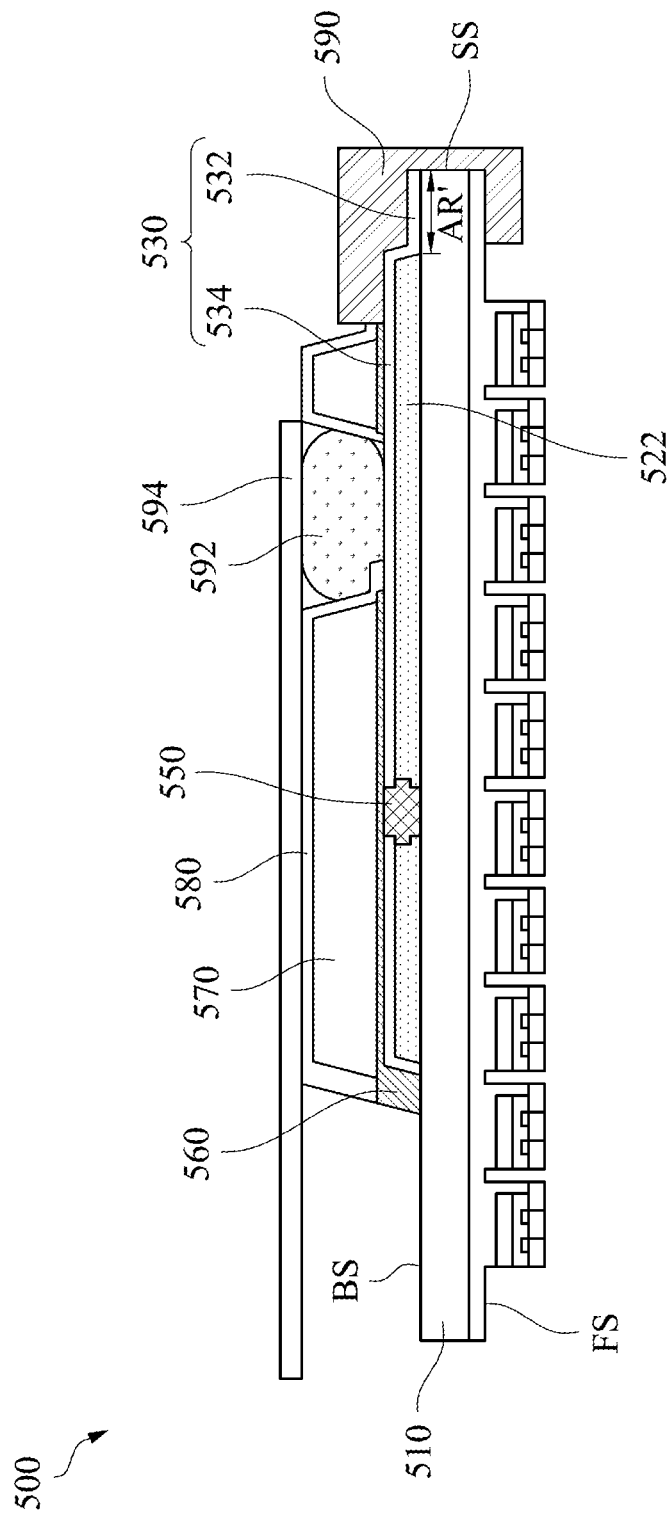
FIG. 14 is a cross-sectional view of some other embodiments of the display panel of the disclosure.

Reference is made to FIG. 14, which is a cross-sectional view of some other embodiments of the display panel of the disclosure. In some embodiments, the display panel 500 includes a substrate 510, a μLED array 512 and a driving circuit 514 at the front surface FS of the substrate 510, a connecting line 522 and a transparent conductive layer 530 at the back surface BS of the substrate 510. There is a distance between the connecting line 522 and an edge of the substrate 510, and the region between the connecting line 522 and the edge of the substrate 510 is the remaining cutting area AR'.

A first portion 532 of the transparent conductive layer 530 is disposed on the cutting area AR' at the back surface BS of the substrate 510 and is directly in contact with the substrate 510. A second portion 534 of the transparent conductive layer 530 is extended from the first portion 532 to the connecting line 522, and the second portion 534 of the transparent conductive layer 530 covers the connecting line 522. The display panel 500 further includes a first passivation layer 560, a second passivation layer 570 on the first passivation layer 560, and a protection layer 580 on the second passivation layer 570. The first passivation layer 560, the second passivation layer 570, and the protection layer 580 partially cover the connecting line 522 to expose a portion of the transparent conductive layer 530. A conductive material 592 of the display panel 500 is coupled to the exposed transparent conductive layer 530, and the conductive material 592 is further coupled to the driving circuit board 594.

A conductive layer 590 connects the transparent conductive layer 530 at the back surface BS of the substrate 510 to the driving circuit 514 at the front surface FS of the substrate 510. Unlike the previous embodiments, the first passivation layer 560, the second passivation layer 570, and the protection layer 580 do not extend into the cutting area AR'. The thickness of the cutting area AR' can be further reduced, and the contact area between the conductive layer 590 and the transparent conductive layer 530 can be increased, thereby improving the reliability of signal transmission.

In some embodiments, the side surface of the transparent conductive layer 530 and the side surface SS of the substrate 510 are aligned and coplanar. In some embodiments, the display panel 500 may be repaired. For example, a broken line issue is found at the connecting line 522 and/or the transparent conductive layer 530, and the repairing metal 550 is embedded in the connecting line 522 and/or the transparent conductive layer 530 and is covered by the first passivation layer 560.

Figure 15:
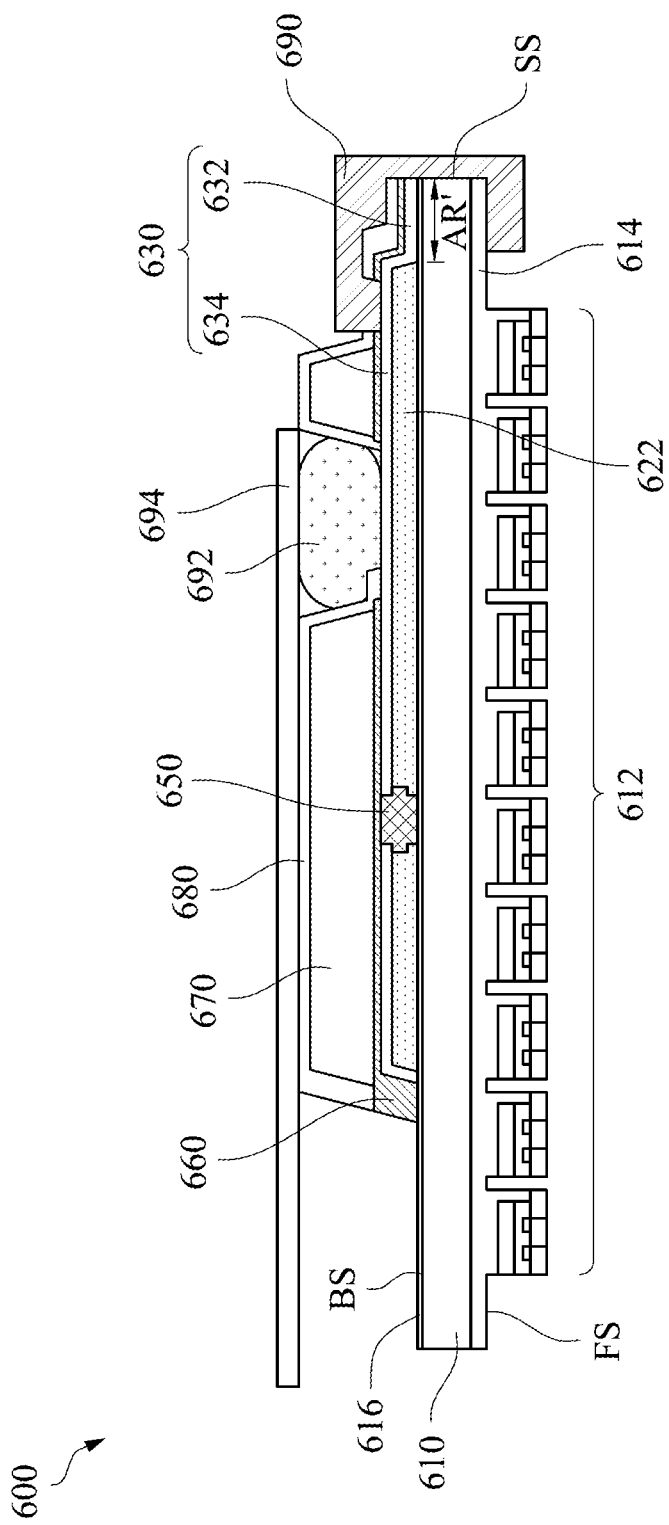
FIG. 15 is a cross-sectional view of some other embodiments of the display panel of the disclosure.

Reference is made to FIG. 15, which is a cross-sectional view of some other embodiments of the display panel of the disclosure. In some embodiments, the display panel 600 includes a substrate 610, a μLED array 612 and a driving circuit 614 at the front surface FS of the substrate 610. A transparent insulating layer 616 can be deposited on the back surface BS of the substrate 610, and a connecting line 622 and a transparent conductive layer 630 are formed on the transparent insulating layer 616. The material of the transparent insulating layer 616 can be polymer such as polyimide (PI) or the like. There is a distance between the connecting line 622 and an edge of the substrate 610, and the region between the connecting line 622 and the edge of the substrate 610 is the remaining cutting area AR'.

A first portion 632 of the transparent conductive layer 630 is disposed on the cutting area AR' at the back surface BS of the substrate 610 and is directly in contact with the transparent insulating layer 616. A second portion 634 of the transparent conductive layer 630 is extended from the first portion 632 to the connecting line 622, and the second portion 634 of the transparent conductive layer 630 partially or entirely covers the connecting line 622. The display panel 600 further includes a first passivation layer 660, a second passivation layer 670 on the first passivation layer 660, and a protection layer 680 on the second passivation layer 670. The first passivation layer 660, the second passivation layer 670, and the protection layer 680 partially cover the connecting line 622 to expose a portion of the transparent conductive layer 630. In some embodiments, the first passivation layer 660, the second passivation layer 670, and the protection layer 680 extend to the cutting area AR'. In some other embodiments, the first passivation layer 660, the second passivation layer 670, and the protection layer 680 do not extend to the cutting area AR.

A conductive material 692 of the display panel 600 is coupled to the exposed transparent conductive layer 630, and the conductive material 692 is further coupled to the driving circuit board 694. A conductive layer 690 of the display panel 600 connects the transparent conductive layer 630 at the back surface BS of the substrate 610 to the driving circuit 614 at the front surface FS of the substrate 610.

In some embodiments, the side surfaces of the transparent conductive layer 630, the first passivation layer 660, the second passivation layer 670, and the protection layer 680 (if exist) and the side surface SS of the substrate 610 are aligned and coplanar. In some embodiments, the display panel 600 may be repaired. For example, a broken line issue is found at the connecting line 622 and/or the transparent conductive layer 630, and the repairing metal 650 is embedded in the connecting line 622 and/or the transparent conductive layer 630 and is covered by the first passivation layer 660.

Figure 16:
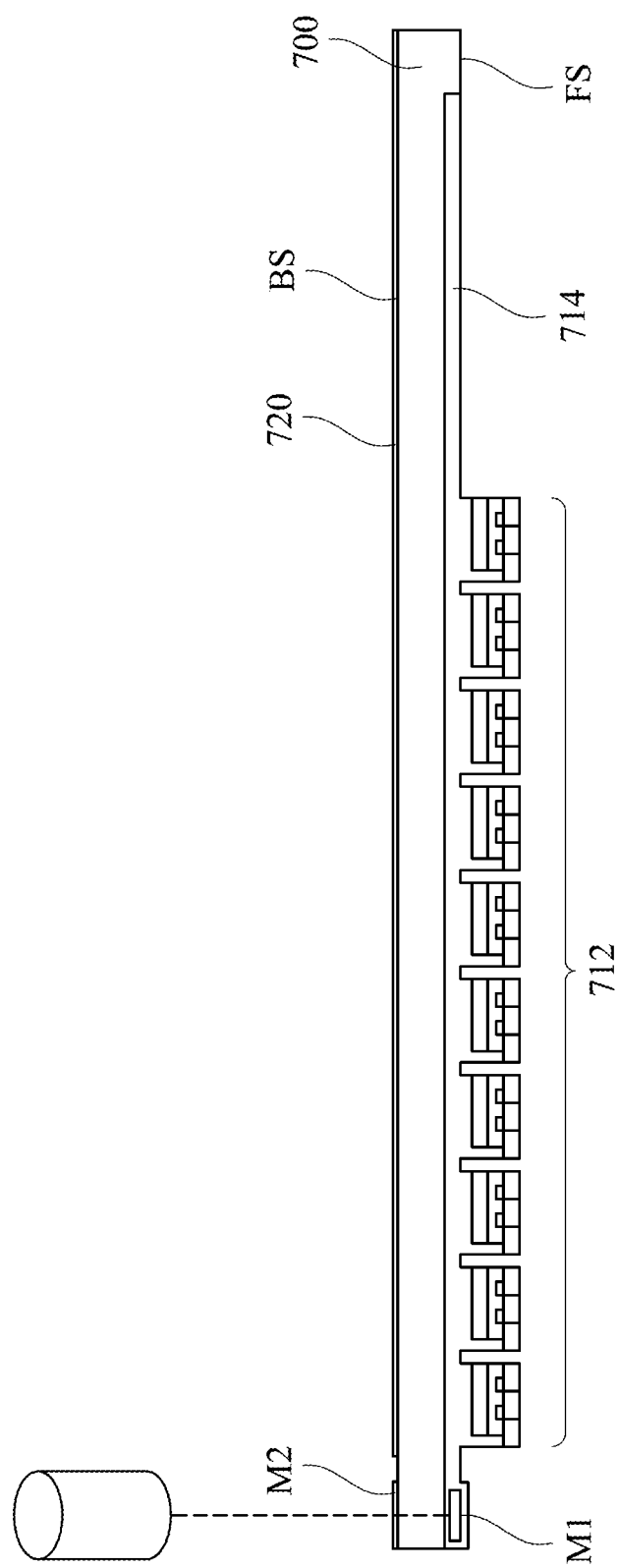
FIG. 16 is a cross-sectional view of a stage of method of manufacturing a display panel, according to some embodiments of the disclosure.

Reference is made to FIG. 16, which is a cross-sectional view of a stage of method of manufacturing a display panel, according to some embodiments of the disclosure. An alignment mark M1 is made on the front surface FS of the substrate 700, and the alignment mark M1 serves as a base during the sequential manufacturing processes, to form a μLED array 712 and a driving circuit 714 at the front surface FS of the substrate 700. After the μLED array 712 and the driving circuit 714 are formed at the front surface FS of the substrate 700, the substrate 700 is flipped, and a transparent insulating layer 720 is deposited on the back surface BS of the substrate 700. An additional alignment mark M2 is formed on the transparent insulating layer 720, in which the alignment mark M2 on the back surface BS of the substrate 700 aligns the alignment mark M1 on the front surface FS of the substrate 700. The alignment mark M2 serves as a base during the sequential manufacturing processes on the back surface BS of the substrate 700, such as the manufacturing processes disclosed in FIG. 3 to FIG. 12. In some other embodiments, the alignment mark M2 can be formed relative to the position of the alignment mark M1, instead of aligning the alignment mark M1.

The method of manufacturing the display panel and the display panel thereof include performing the electrical test to the metal layer and the transparent conductive layer right after the metal layer and the transparent conductive layer are patterned. The defect can be found and repaired after the electrical test is performed. Because there is no other layer covering the connecting line and the transparent conductive layer when the defect is detected and repaired, the position of the defect can be observed easily, and the repairing metal can be filled in the defect easily. The cutting area does not include the metal layer such that the thickness of the cutting area is reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel comprising:
   a substrate having a front surface and a back surface opposite to each other;
   a light-emitting diode (LED) array disposed on the front surface of the substrate;
   a driving circuit disposed on the front surface of the substrate and being coupled to the LED array;
   a connecting line disposed on the back surface of the substrate, wherein the connecting line is spaced from a side surface of the substrate by a distance such that a cutting area is defined;
   a transparent conductive layer disposed on the back surface of the substrate, wherein the transparent conductive layer is extended from the cutting area and at least partially covers the connecting line;
   a first passivation layer disposed on the transparent conductive layer and the connecting line, wherein a side surface of the first passivation layer, a side surface of the transparent conductive layer, and the side surface of the substrate are aligned; and
   a conductive layer, wherein an end of the conductive layer penetrates the first passivation layer to couple to the transparent conductive layer, and another end of the conductive layer couples to the driving circuit.

2. The display panel of claim 1, wherein the connecting line comprises a first region adjacent the cutting area, a third region, and a second region between the first region and the third region, the transparent conductive layer covers the first region and the second region, and the first passivation layer is disposed on the first region and the third region.

3. The display panel of claim 2, further comprising:
   a driving circuit board; and
   a conductor material connecting the transparent conductive layer on the second region to the driving circuit board.

4. The display panel of claim 2, further comprising:
   a second passivation layer disposed on a first portion of the first passivation layer on the first region and the third region; and
   a protection layer disposed on the second passivation layer and disposed on a second portion of the first passivation layer on cutting area.

5. The display panel of claim 2, wherein the first passivation layer directly contacts the third region of the connecting line.

6. The display panel of claim 2, wherein the transparent conductive layer is disposed between the first passivation layer and the third region of the connecting line.

7. The display panel of claim 1, further comprising:
   a repairing metal embedded in the connecting line and covered by the first passivation layer.

8. The display panel of claim 1, further comprising:
   a repairing metal embedded in the connecting line and the transparent conductive layer and covered by the first passivation layer.

9. The display panel of claim 1, further comprising:
   a transparent insulating layer disposed between the connecting line and the substrate.

10. The display panel of claim 9, wherein the transparent conductive layer directly contacts the transparent insulating layer, at the cutting area.

11. The display panel of claim 1, wherein the transparent conductive layer directly contacts the substrate, at the cutting area.

* * * * *